(12) United States Patent
Takanami et al.

(10) Patent No.: US 11,270,873 B2
(45) Date of Patent: Mar. 8, 2022

(54) SUBSTRATE PROCESSING APPARATUS AND SUBSTRATE PROCESSING METHOD

(71) Applicant: Canon Anelva Corporation, Kawasaki (JP)

(72) Inventors: Yuji Takanami, Tokyo (JP); Kento Norota, Sagamihara (JP); Naoyuki Okamoto, Sagamihara (JP); Yasuo Kato, Machida (JP); Yasushi Yasumatsu, Inagi (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 16/928,086

(22) Filed: Jul. 14, 2020

(65) Prior Publication Data
US 2020/0343080 A1    Oct. 29, 2020

Related U.S. Application Data

(63) Continuation of application No. PCT/JP2019/003362, filed on Jan. 31, 2019.

(30) Foreign Application Priority Data

Feb. 6, 2018   (JP) .............................. JP2018-019569

(51) Int. Cl.
*H01J 37/34* (2006.01)
*C23C 14/34* (2006.01)
(Continued)

(52) U.S. Cl.
CPC ...... *H01J 37/3435* (2013.01); *C23C 14/3442* (2013.01); *C23C 14/46* (2013.01); *H01J 37/32733* (2013.01); *H01J 2237/332* (2013.01)

(58) Field of Classification Search
None
See application file for complete search history.

(56) References Cited

U.S. PATENT DOCUMENTS 3,537,973 A * 11/1970 Laib ........................ C23C 14/35
204/298.26
5,733,418 A    3/1998 Hershcovitch et al.
(Continued)

FOREIGN PATENT DOCUMENTS

CN         1372502 A    10/2002
CN       104409307 A     3/2015
(Continued)

OTHER PUBLICATIONS

International Preliminary Report on Patentability (PCT/IPEA/409) dated Jan. 9, 2020, by the Japanese Patent Office as the International Preliminary Examining Authority for International Application No. PCT/JP2019/003362.
(Continued)

*Primary Examiner* — Jason Berman
(74) *Attorney, Agent, or Firm* — Buchanan Ingersoll & Rooney PC

(57) ABSTRACT

A substrate processing apparatus that processes a substrate using particles, includes a conveyance mechanism configured to convey the substrate along a conveyance surface, a particle source configured to emit particles, a rotation mechanism configured to make the particle source pivot about a rotation axis, and a movement mechanism configured to move the particle source such that a distance between the particle source and the conveyance surface is changed.

15 Claims, 7 Drawing Sheets

(51) Int. Cl.
*C23C 14/46* (2006.01)
*H01J 37/32* (2006.01)

(56) References Cited

U.S. PATENT DOCUMENTS

| | | | | |
|---|---|---|---|---|
| 6,224,718 | B1* | 5/2001 | Meyer | C23C 14/3407 |
| | | | | 204/192.11 |
| 6,344,114 | B1* | 2/2002 | Sichmann | C23C 14/35 |
| | | | | 204/192.12 |
| 2002/0098776 | A1 | 7/2002 | Dopper | |
| 2003/0085122 | A1* | 5/2003 | Takahashi | H01J 37/3435 |
| | | | | 204/298.23 |

FOREIGN PATENT DOCUMENTS

| JP | S5019681 A | 3/1975 |
|---|---|---|
| JP | H0347964 A | 2/1991 |
| JP | 2001526323 A | 12/2001 |
| JP | 2005336535 A | 12/2005 |
| JP | 2006124821 A | 5/2006 |
| JP | 2009041115 A | 2/2009 |

OTHER PUBLICATIONS

International Search Report (PCT/ISA/210) and translation and Written Opinion (PCT/ISA/237) dated Apr. 23, 2019, by the Japanese Patent Office as the International Searching Authority for International Application No. PCT/JP2019/003362.
Decision to Grant a Patent for Japanese Application 2016-150526, dated Jun. 22, 2020 (7 pages).
The First Office Action dated Jan. 4, 2022, by the State Intellectual Property Office of the People's Republic of China in corresponding Chinese Patent Application No. 201980011687.X and an English translation of the Action. (17 pages).

* cited by examiner

SUBSTRATE PROCESSING APPARATUS AND SUBSTRATE PROCESSING METHOD

CROSS-REFERENCE TO RELATED APPLICATION(S)

This application is a continuation of International Patent Application No. PCT/JP2019/003362 filed on Jan. 31, 2019, which claims priority to and the benefit of Japanese Patent Application No. 2018-019569 filed on Feb. 6, 2018, the entire disclosures of which are incorporated herein by reference.

TECHNICAL FIELD

The present invention relates to a substrate processing apparatus and a substrate processing method.

BACKGROUND ART

There is a substrate processing apparatus that processes a substrate using particles emitted from a particle source. The particle source can be, for example, a target held by a cathode, or an ion beam source. When the particle source is a target, the substrate processing apparatus can be used as a sputtering apparatus (deposition apparatus). When the particle source is an ion beam source, the substrate processing apparatus can be used as an etching apparatus or an ion implantation apparatus.

PTL 1 discloses a deposition apparatus that forms a thin film on a base having an uneven shape. The deposition apparatus described in PTL 1 includes a cathode unit rotatable about an axis in a Y direction, a rotating shaft that rotates a base holder, a driving system that drives the rotating shaft in its axial direction, and a driving system that swings the rotating shaft in an X-Z plane.

CITATION LIST

Patent Literature

PTL 1: Japanese Patent Laid-Open No. 2005-336535

SUMMARY OF INVENTION

Technical Problem

In the arrangement in which the posture (inclination) and position of a substrate (base) are controlled as in the deposition apparatus described in PTL 1, when a film is formed on a substrate having a concave shape, the range in which the distance between the target and the substrate and the relative posture between the target and the substrate can be adjusted can be limited. In order to increase the adjustable range, it is required to increase the adjustment range of the posture and position of the substrate and the pivot range of the cathode unit, but this can lead to an increase in size of the deposition apparatus.

The present invention has as its object to provide a technique advantageous in adjusting the distance between a particle source and a substrate and the relative posture between the particle source and the substrate.

Solution to Problem

The first aspect of the present invention relates to a substrate processing apparatus that processes a substrate using particles. The substrate processing apparatus comprises a conveyance mechanism configured to convey the substrate along a conveyance surface, a particle source configured to emit particles, a rotation mechanism configured to make the particle source pivot about a rotation axis, and a movement mechanism configured to move the particle source such that a distance between the particle source and the conveyance surface is changed.

The second aspect of the present invention relates to a substrate processing method of processing a substrate. The substrate processing method comprises a processing step of processing the substrate using particles emitted from a particle source while conveying the substrate along a conveyance surface and controlling a posture and a position of the particle source that emits particles, wherein a target processing portion of the substrate changes as the substrate is conveyed, and the processing step includes a driving step of, in accordance with a change of the target processing portion of the substrate, making the particle source pivot about a rotation axis and moving the particle source such that a distance between the particle source and the conveyance surface is changed.

Advantageous Effects of Invention

According to the present invention, a technique advantageous in adjusting the distance between a particle source and a substrate and the relative posture between the particle source and the substrate is provided.

Other features and advantages of the present invention will become apparent from the description provided hereinafter with reference to the accompanying drawings. Note that the same reference numerals denote the same or similar components in the accompanying drawings.

DESCRIPTION OF EMBODIMENTS

Figure 1:
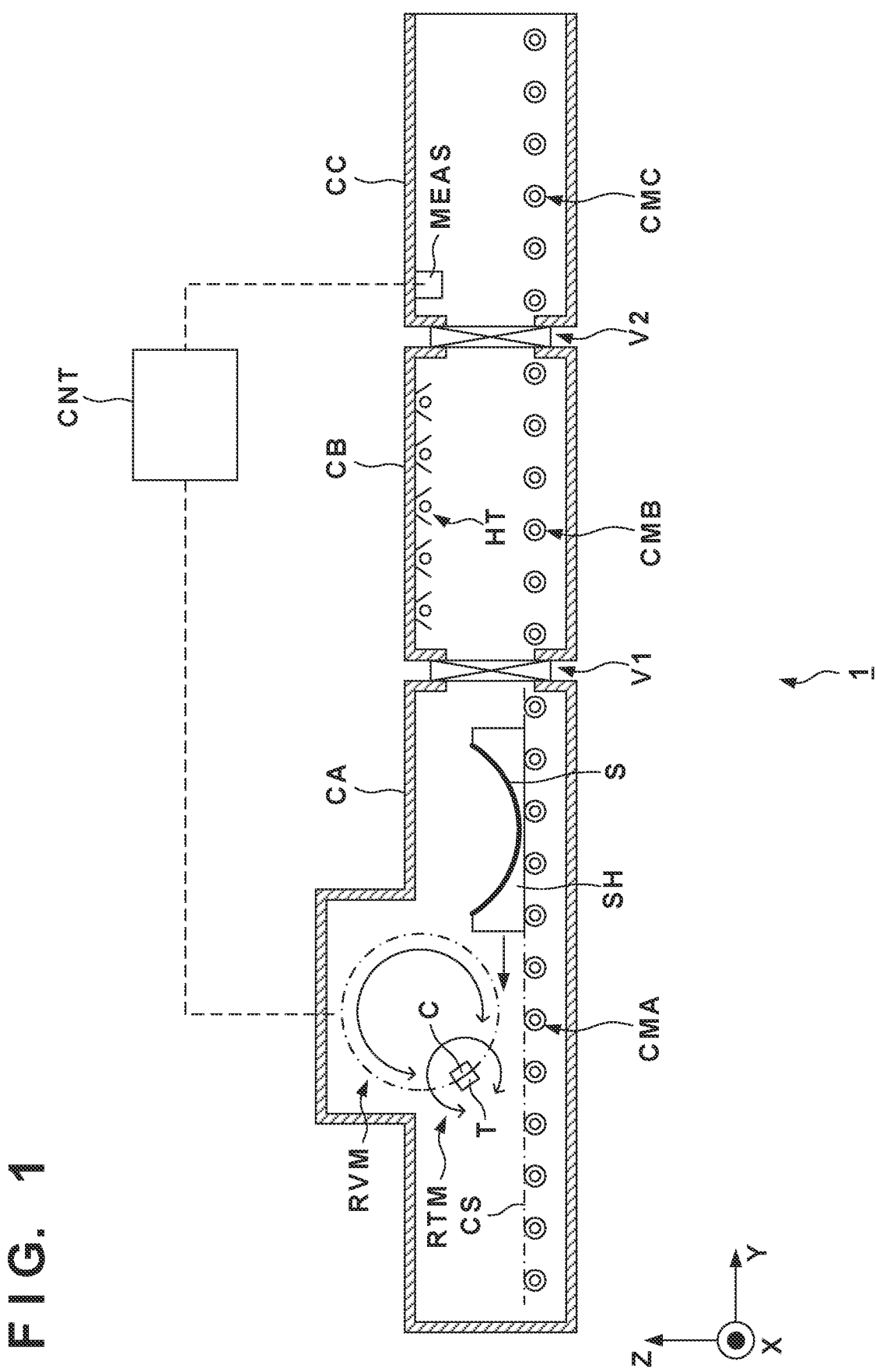
FIG. 1 is a view schematically showing the arrangement of a sputtering apparatus according to the first embodiment of the present invention.

Hereinafter, embodiments of the present invention will be explained in detail with reference to the accompanying drawings. It is to be understood that the following embodiments are not intended to limit the claims of the present invention. A plurality of features are described in the embodiments, but all of the plurality of features are not necessarily essential to the present invention, and the plurality of features may be arbitrarily combined. The same reference numerals denote the same or similar components in the accompanying drawings, and a repetitive description thereof will be omitted.

The present invention will be described below through its exemplary embodiments with reference to the accompanying drawings. The present invention relates to a substrate processing apparatus and a substrate processing method for processing a substrate using particles emitted from a particle source. The particle source is, for example, a target held by a cathode, and the substrate processing apparatus can be configured as a sputtering apparatus that forms a film on a substrate using particles emitted by sputtering of the cathode. Alternatively, the particle source is an ion beam source, and the substrate processing apparatus can be configured as an etching apparatus that etches a substrate using particles emitted from the ion beam source, or an ion implantation apparatus that implants particles emitted from the ion beam source into a substrate.

An example in which the substrate processing apparatus according to the present invention is applied to a sputtering apparatus will be described below. However, by replacing the particle source in the following description with an ion beam source, the substrate processing apparatus described below can function as an etching apparatus that etches a substrate or an ion implantation apparatus that implants ions into a substrate.

FIG. 1 schematically shows the arrangement of a sputtering apparatus 1 according to the first embodiment of the present invention. The sputtering apparatus 1 can include a sputtering chamber CA, a conveyance mechanism CMA that conveys a substrate S along a conveyance surface CS in the sputtering chamber CA, and a cathode C that holds a target T (particle source) in the sputtering chamber CA. The sputtering apparatus 1 can further include a rotation mechanism RTM that makes the cathode C pivot about a rotation axis, and a movement mechanism RVM that moves the cathode C such that the distance between the cathode C and the conveyance surface CS is changed. Here, the distance between the cathode C and the conveyance surface CS can be adjusted or controlled by the movement mechanism RVM such that the distance between the target T and a film formation portion of the substrate S is set to a predetermined distance.

The substrate S includes, for example, a surface having a concave shape, and a film can be formed on the surface by sputtering. The surface can be, for example, a surface forming a part of a cylindrical surface, a surface forming a part of a spherical surface, or a paraboloid, but may have another shape. The present invention is advantageous in forming a film on a concave surface of a substrate, but may be applied to form a film on a convex surface of a substrate.

The substrate S can be conveyed by the conveyance mechanism CMA along the conveyance surface CS while being held by a substrate holder SH. The substrate S can be, for example, a base material or a base of an optical element such as a mirror. The conveyance mechanism CMA can be, for example, a roller conveyor, but may be another type of conveyance mechanism.

In addition, the sputtering apparatus 1 can include a vacuum pump (for example, a turbo molecular pump, a dry pump, a cryopump, or the like) for reducing the pressure in the internal space of the sputtering chamber CA. Further, the sputtering apparatus 1 can include a gas supply unit that supplies a gas (for example, an argon gas) to the internal space of the sputtering chamber CA. Furthermore, the sputtering apparatus 1 can include a high-frequency supply source that supplies a high frequency between the cathode C and the substrate S and/or the sputtering chamber CA.

The sputtering apparatus 1 may further include a load lock chamber CB. The load lock chamber CB can be connected to the sputtering chamber CA via a gate valve V1. In the load lock chamber CB, a vacuum pump that reduces the pressure in the internal space of the load lock chamber CB can be provided. Further, a conveyance mechanism CMB for conveying the substrate S in the load lock chamber CB can be provided in the load lock chamber CB. A heater HT that heats the substrate S may be provided in the load lock chamber CB.

The sputtering apparatus 1 can include a port CC that provides a relay place for loading the substrate S into the load lock chamber CB and unloading the substrate S from the load lock chamber CB. The port CC can be connected to the load lock chamber CB via a gate valve V2. In the port CC, a conveyance mechanism CMC for conveying the substrate S in the port CC can be provided. In addition, a measurement device MEAS for measuring the shape of the surface of the substrate S can be provided in the port CC. The measurement device MEAS can be, for example, a three-dimensional shape measurement device. The measurement device MEAS can, for example, measure the shape of the surface of the substrate S in a state in which the substrate S is scanned by the conveyance mechanism CMC, and generate surface shape information.

The sputtering apparatus 1 can include a control unit CNT that controls the conveyance mechanisms CMA, CMB, and CMC, the rotation mechanism RTM, the movement mechanism RVM, the heater HT, and the measurement device MEAS. The control unit CNT can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer installed with a program, or a combination of all or some of these components.

In the example shown in FIG. 1, the substrate S can be loaded into the port CC and conveyed to the load lock chamber CB via the gate valve V2 by the conveyance mechanisms CMC and CMB. Here, when the shape of the surface of the substrate S is unknown, it can be measured by the measurement device MEAS. Based on surface shape information (information indicating the shape of the surface of the substrate S) obtained as a result of measurement by the measurement device MEAS or surface shape information of the substrate S provided via an input device (not shown), the control unit CNT can generate control information to control the rotation mechanism RTM and the movement mechanism RVM.

When the substrate S is loaded into the load lock chamber CB, the pressure in the internal space of the load lock chamber CB can be reduced. In addition, as needed, the substrate S can be heated by the heater HT. After that, the substrate S can be conveyed to the internal space of the sputtering chamber CA via the gate valve V1 by the conveyance mechanisms CMB and CMA.

In the sputtering chamber CA, a film forming step can be performed in which a film is formed on the substrate S by sputtering while conveying the substrate S in a first conveyance direction along the conveyance surface CS and controlling the posture and position of the cathode C holding the target T. A film formation portion, which is a portion where a film is formed (a portion where a film grows) of the entire surface of the substrate S, can change as the substrate S is conveyed by the conveyance mechanism CMA. Here, it can be said that a film formation portion is a portion to be processed, that is, a target processing portion. The film forming step can include a driving step of, in accordance with a change of the film formation portion of the substrate S, making the cathode C pivot about the rotation axis and moving the cathode C such that the distance between the cathode C and the conveyance surface CS is changed. In the driving step, the distance between the cathode C and the conveyance surface CS can be adjusted or controlled by the driving mechanism RVM such that the distance between the target T and the film formation portion of the substrate S is set to a predetermined distance.

After the film is formed on the entire surface (or the entire region where the film is to be formed) of the substrate S, the substrate S is conveyed by the conveyance mechanism CMA in a second conveyance direction opposite to the first conveyance direction, and further conveyed to the internal space of the load lock chamber CB via the gate valve V1 by the conveyance mechanisms CMA and CMB. After that, the pressure in the load lock chamber CB is returned to the atmospheric pressure, and the substrate S can be conveyed to the port CC by the conveyance mechanisms CMB and CMC.

Figure 2:
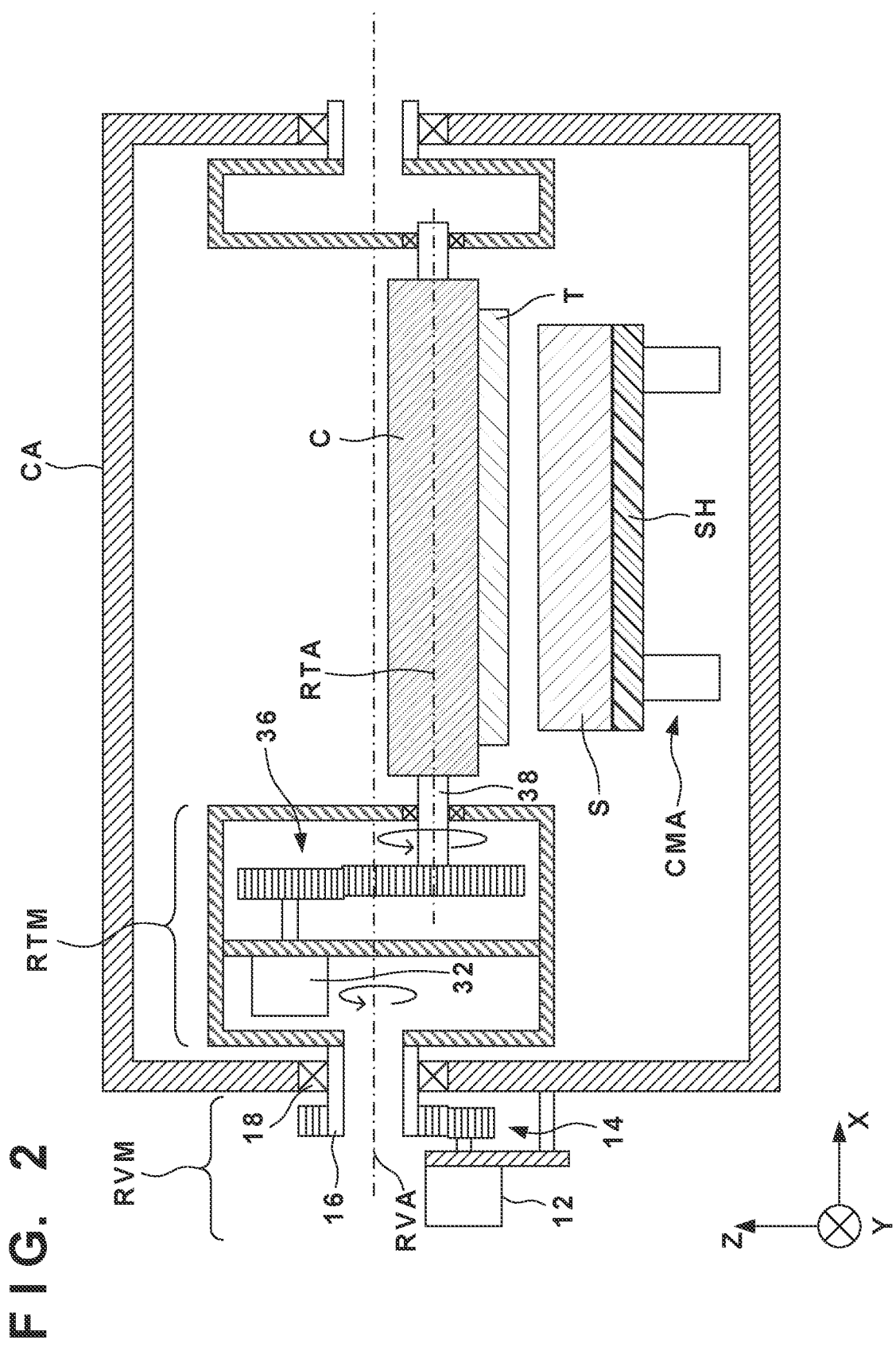
FIG. 2 is a view schematically showing the arrangement of a sputtering apparatus according to the second embodiment of the present invention.
Figure 3:
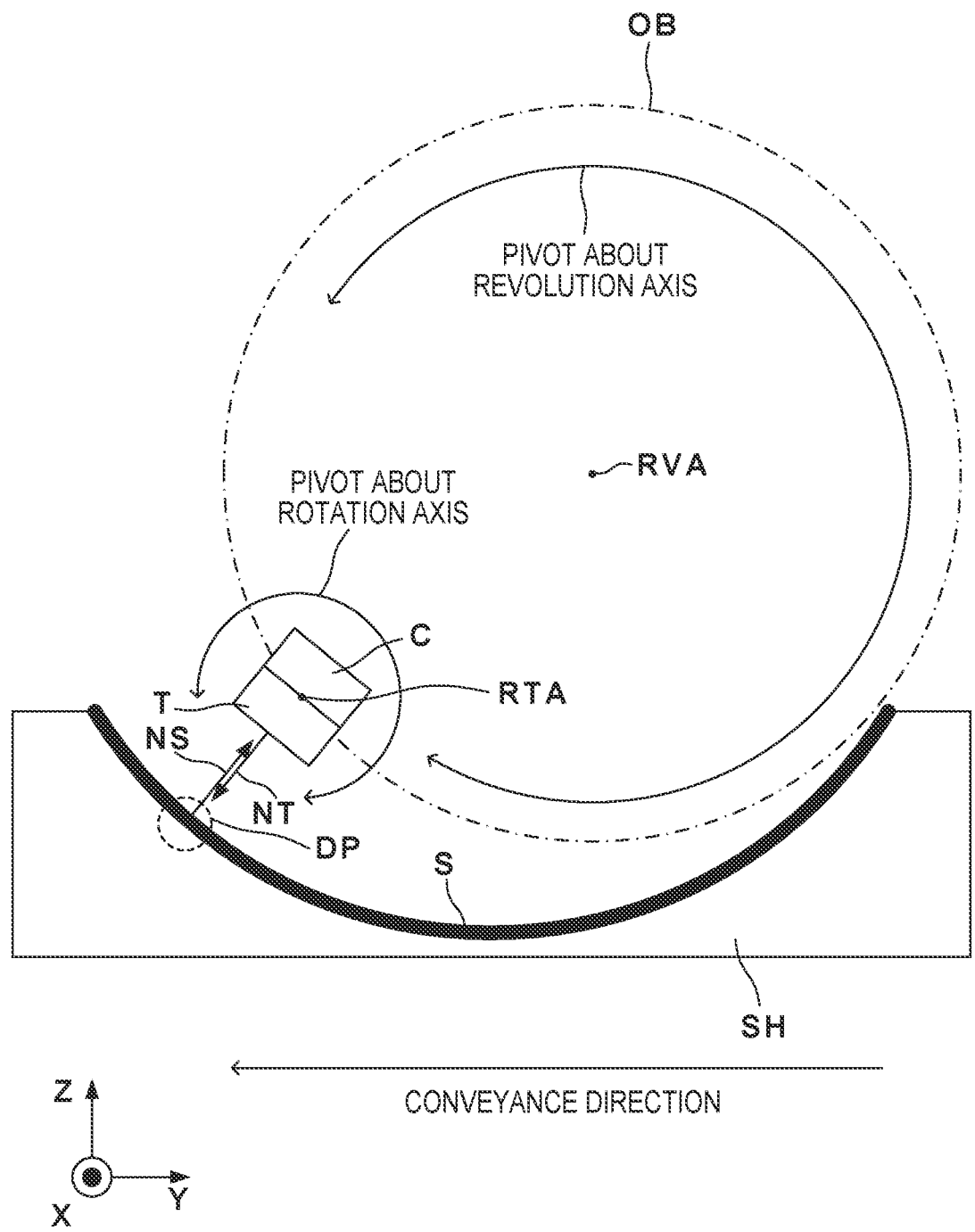
FIG. 3 is a view schematically showing adjustment or control of the posture and position of a target (cathode) that can be performed by a rotation mechanism and a movement mechanism under the control of a control unit.

FIG. 2 schematically shows an example of the arrangements of the rotation mechanism RTM and the movement mechanism RVM. FIG. 3 schematically shows adjustment or control of the posture and position of the target T (cathode C) that can be performed by the rotation mechanism RTM and the movement mechanism RVM under the control of the control unit CNT. The movement mechanism RVM can be embodied as, for example, a revolution mechanism that moves the cathode C, by making the cathode C pivot along a revolution orbit OB, such that the distance between the cathode C and the conveyance surface CS (film formation portion DP) is changed. The movement mechanism RVM can include, for example, a motor 12, a rotating shaft 16 connected to the rotation mechanism RTM, a bearing 18 supporting the rotating shaft 16, and a gear mechanism 14 that transmits an output (pivot) of the motor 12 to the rotating shaft 16. The rotation mechanism RTM can include, for example, a motor 32, a rotating shaft 38 supporting the cathode C, and a gear mechanism 36 that transmits an output (pivot) of the motor 32 to the rotating shaft 38.

The film formation portion DP (see FIG. 3) of the substrate S can change as the substrate S is conveyed by the conveyance mechanisms CMA. The rotation mechanism RTM and the movement mechanism RVM can adjust or control, under the control of the control unit CNT, the posture and position of the cathode C (target T) such that the angle between a normal NS of the film formation portion DP of the substrate S and a normal NT (a normal of the particle source) of the surface of the target T is set to a predetermined angle. Preferably, the rotation mechanism RTM and the movement mechanism RVM can adjust or control, under the control of the control unit CNT, the posture and position of the cathode C (target T) such that the normal NS of the film formation portion DP of the substrate S becomes parallel to a normal NT of the surface of the target T.

Further, the rotation mechanism RTM and the movement mechanism RVM can adjust or control, under the control of the control unit CNT, the posture and position of the cathode C (target T) such that the angle between the normal NS of the film formation portion DP of the substrate S and the normal NT of the surface of the target T is set to the predetermined angle and the distance between the film formation portion DP and the target T is set to the predetermined distance. Preferably, the rotation mechanism RTM and the movement mechanism RVM can adjust or control, under the control of the control unit CNT, the posture and position of the cathode C (target T) such that the normal NS of the film formation portion DP of the substrate S becomes parallel to the normal NT of the surface of the target T and the distance between the film formation portion DP and the target T is set to the predetermined distance.

A rotation axis RTA can be parallel to a second direction (a direction parallel to the X-axis) orthogonal to a first direction parallel to the conveyance direction (the direction parallel to the Y-axis) of the substrate S by the conveyance mechanism CMA, and a revolution axis RVA of the revolution orbit OB can be parallel to the second direction.

Figure 4:
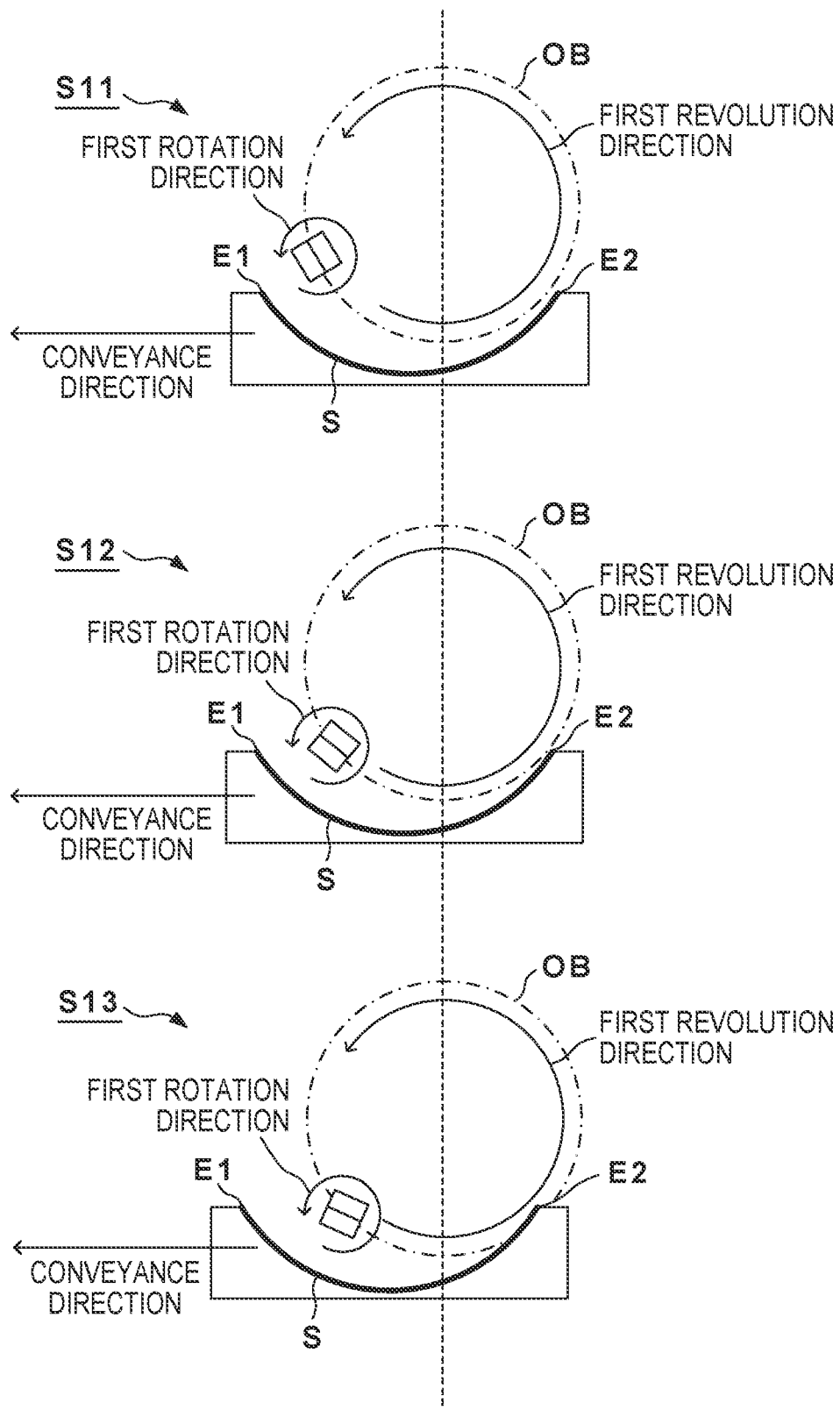
FIG. 4 is a view showing, in time series, a process in which a film is formed on a substrate by sputtering in the sputtering apparatus.
Figure 5:
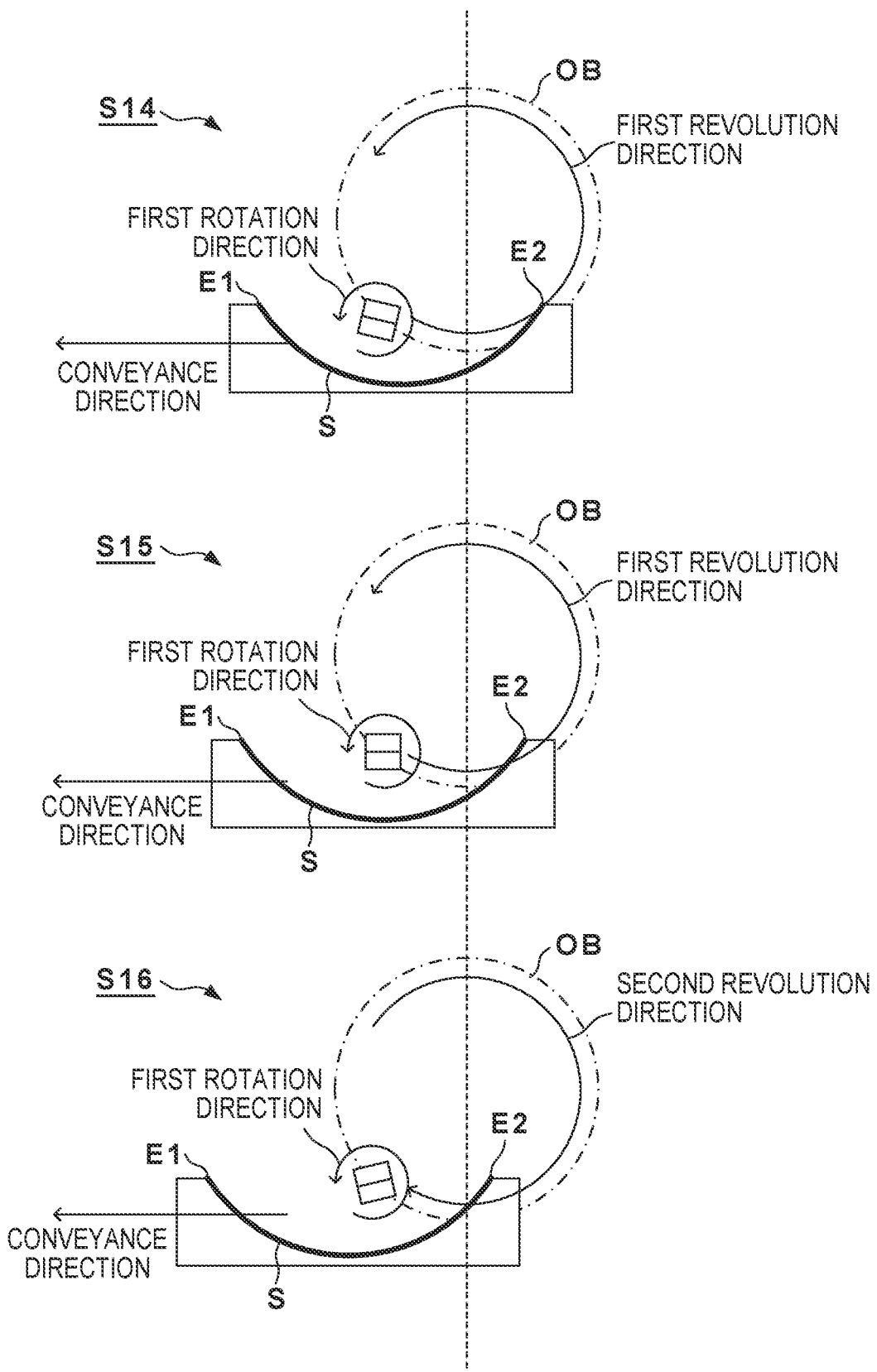
FIG. 5 is a view showing, in time series, the process in which the film is formed on the substrate by sputtering in the sputtering apparatus.
Figure 6:
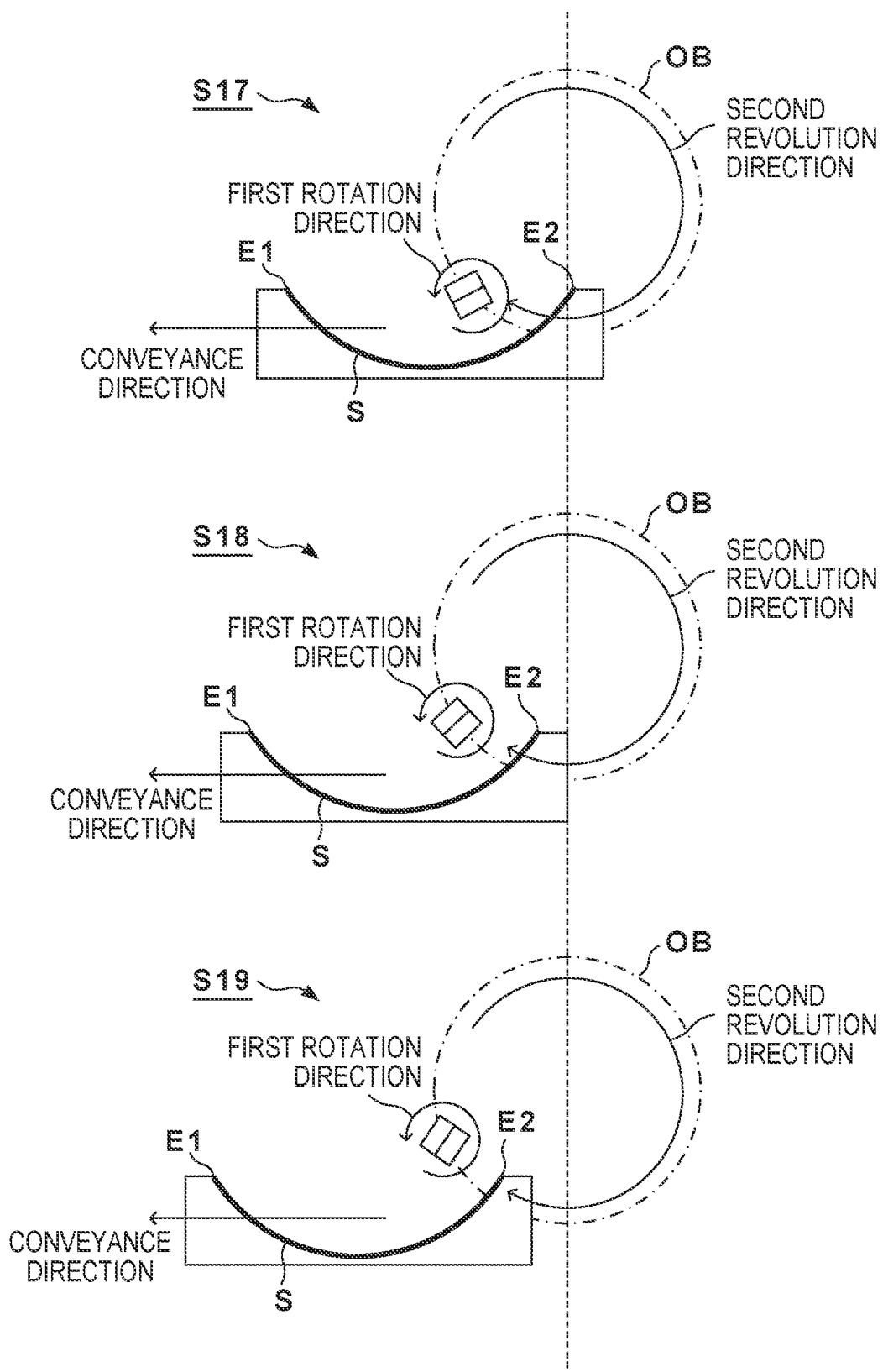
FIG. 6 is a view showing, in time series, the process in which the film is formed on the substrate by sputtering in the sputtering apparatus.

FIGS. 4 to 6 show, in time series, a process in which a film is formed on the substrate S by sputtering in the sputtering apparatus 1. The process advances in the order of states S11, S12, S13, S14, S15, S16, S17, S18, and S19. The substrate S includes one end E1 in the conveyance direction by the conveyance mechanism CMA and the other end E2 in the conveyance direction by the conveyance mechanism CMA, and a film can be formed in a region from the one end E1 to the other end E2.

In the process exemplarily shown in FIGS. 4 to 6, the surface of the substrate S has a concave shape in a section (X-Z section) along the conveyance direction. In the example shown in FIGS. 4 to 6, while the substrate S is conveyed in the conveyance direction by the conveyance mechanism CMA and a film is formed in the region from the one end E1 to the other end E2 of the substrate S, the movement mechanism RVM makes the cathode C (target T) pivot along the revolution orbit OB in a first revolution direction, and then makes it pivot along the revolution orbit OB in a second revolution direction opposite to the first revolution direction. Further, in the example shown in FIGS. 4 to 6, while the substrate S is conveyed in the conveyance direction by the conveyance mechanism CMA and the film is formed in the region from the one end E1 to the other end E2 of the substrate S, the rotation mechanism RTM makes the cathode C (target T) pivot about the rotation axis RTA only in one rotation direction.

In one arrangement example, the cathode C is arranged above the conveyance surface CS, and the lowest point of the revolution orbit OB is lower than the allowable highest point of the substrate S (the highest point in the substrate S that can be processed in the sputtering apparatus 1). In another arrangement example, the cathode C is arranged above the conveyance surface CS, and the lowest point of the revolution orbit OB is higher than the allowable highest point of the substrate S (the highest point in the substrate S that can be processed in the sputtering apparatus 1).

Before starting film formation on the substrate S, in a state in which each of the target T and the cathode C is retracted to a position at which it does not collide with the substrate S, the substrate S can be conveyed by the conveyance mechanism CMA to a position indicated as the state S11. Then, the rotation mechanism RTM and the movement mechanism RVM can control, under the control of the control unit CNT, the posture and position of the cathode C (target T) such that the normal NS of the film formation portion DP of the substrate S becomes parallel to the normal NT of the surface of the target T and the distance between the film formation portion DP and the target T is set to a target distance. With this operation, the relative position and posture between the substrate S and the target T are set as shown in the state S11. In this state, the process of forming a film on the substrate S while conveying the substrate S by the conveyance mechanism CMA is started.

Subsequently, the process advances to the state S19 through the states S12, S13, S14, S15, S16, S17, and S18, and the film formation in the region from the one end E1 to the other end E2 is completed. Thereafter, in a state in which each of the target T and the cathode C is retracted to the position at which it does not collide with the substrate S, the substrate S is conveyed from the sputtering chamber CA to the load lock chamber CB by the conveyance mechanisms CMA and CMB, and further conveyed to the port CC by the conveyance mechanisms CMB and CMC.

According to this embodiment, the rotation mechanism RTM that makes the cathode C pivot about the rotation axis and the movement mechanism RVM that moves the cathode C so as to change the distance between the cathode C and the conveyance surface CS are provided, so that a film can be formed on the surface S having the concave shape while conveying the substrate S. Such an arrangement is more advantageous in reducing the size of the sputtering apparatus than the arrangement in which the relative position and posture between the target and the substrate are adjusted or controlled by making the substrate S revolve or pivot.

Figure 7:
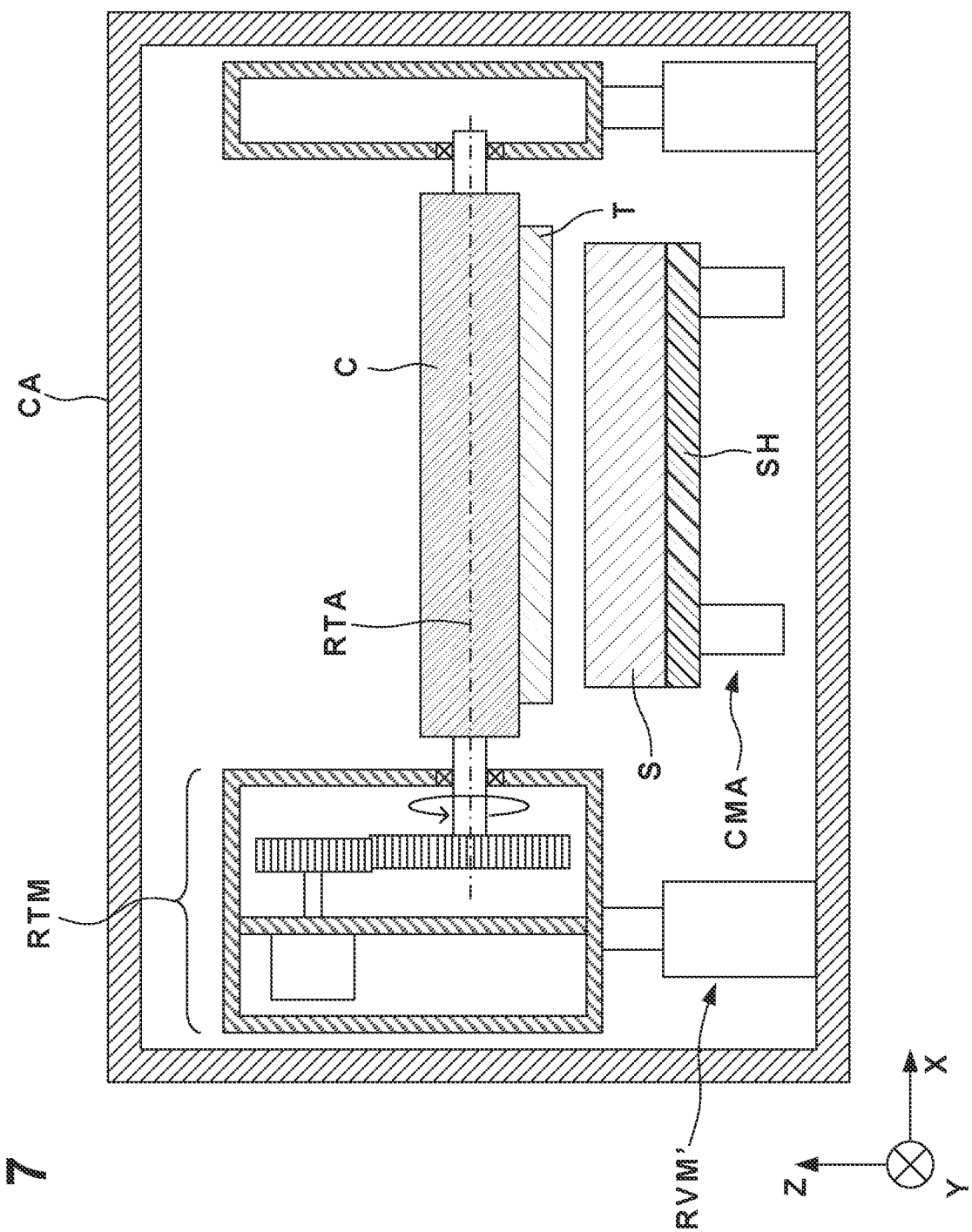
FIG. 7 is a view schematically showing the arrangement of a sputtering apparatus according to the second embodiment of the present invention.

FIG. 7 shows the second embodiment of a sputtering apparatus 1 or a sputtering chamber CA. Components not described as the second embodiment can follow the first embodiment described with reference to FIGS. 1 to 6. In the second embodiment, the movement mechanism RVM in the first embodiment is changed to a movement mechanism RVM'. The movement mechanism RVM' is embodied as an elevation mechanism that elevates a cathode C, thereby moving the cathode C such that the distance between the cathode C and a conveyance surface CS (film formation portion) is changed.

The present invention is not limited to the above-described embodiments, and various changes and modifications can be made within the sprit and scope of the present invention. Therefore, to apprise the public of the scope of the present invention, the following claims are made.

REFERENCE SIGNS LIST

1: sputtering apparatus, CA: sputtering chamber, CB: load lock chamber, CC: port, CMA: conveyance mechanism, CMB: conveyance mechanism, CMC: conveyance mechanism, CS: conveyance surface, C: cathode, T: target, S: substrate, RTM: rotation mechanism, RVM: movement mechanism (revolution mechanism), RVM': movement mechanism (elevation mechanism), RTA: rotation axis, RVA: revolution axis, OB: revolution orbit, DP: film formation portion

The invention claimed is:

1. A substrate processing apparatus that processes a substrate using particles, comprising:
a conveyance mechanism configured to convey the substrate in a predetermined conveyance direction along a conveyance surface;
a particle source configured to emit particles, wherein a target processing portion of the substrate, which is a portion to be processed using the particles, changes in accordance with the conveyance of the substrate by the conveyance mechanism;
a rotation mechanism configured to make the particle source pivot about a rotation axis orthogonal to the conveyance direction;
a movement mechanism configured to move the particle source such that a distance between the particle source and the conveyance surface is changed, wherein the movement mechanism is distinct from the rotation mechanism; and
a controller configured to rotate the rotation mechanism and actuate the movement mechanism based on the conveyance of the substrate by the conveyance mechanism.

2. The substrate processing apparatus according to claim 1, wherein
the controller is configured to control the rotation mechanism and the movement mechanism so as to control a posture and a position of the particle source such that an angle between a normal of the target processing portion of the substrate and a normal of the particle source is set to a predetermined angle.

3. The substrate processing apparatus according to claim 1, wherein
the controller is configured to control the rotation mechanism and the movement mechanism so as to control a posture and a position of the particle source such that a normal of the target processing portion of the substrate becomes parallel to a normal of the particle source.

4. The substrate processing apparatus according to claim 2, wherein the controller is configured to control the rotation mechanism and the movement mechanism so as to control the posture and the position of the particle source such that a distance between the target processing portion and the particle source is set to a predetermined distance.

5. The substrate processing apparatus according to claim 1, wherein by making the particle source pivot along a revolution orbit, the movement mechanism moves the particle source such that the distance between the particle source and the conveyance surface is changed.

6. The substrate processing apparatus according to claim 5, wherein a revolution axis of the revolution orbit is parallel to the rotation axis.

7. The substrate processing apparatus according to claim 6, wherein while the substrate is conveyed in the conveyance direction by the conveyance mechanism and a film is formed in a region from one end of the substrate in the conveyance direction to the other end of the substrate in the conveyance direction, the movement mechanism makes the particle source pivot along the revolution orbit in a first revolution direction, and then makes the particle source pivot along the revolution orbit in a second revolution direction opposite to the first revolution direction.

8. The substrate processing apparatus according to claim 6, wherein while the substrate is conveyed in the conveyance direction by the conveyance mechanism and a film is formed in a region from one end of the substrate in the conveyance direction to the other end of the substrate in the conveyance direction, the rotation mechanism makes the particle source pivot about the rotation axis only in one rotation direction.

9. The substrate processing apparatus according to claim 1, wherein by elevating the particle source, the movement mechanism moves the particle source such that the distance between the particle source and the conveyance surface is changed.

10. The substrate processing apparatus according to claim 1, the controller is configured to generate, based on surface shape information indicating a shape of a surface of the substrate, control information for controlling the rotation mechanism and the movement mechanism.

11. The substrate processing apparatus according to claim 10, further comprising a measurement device configured to measure a shape of the substrate to generate the surface shape information.

12. The substrate processing apparatus according to claim 1, wherein
   the particle source is a target held by a cathode, and
   the substrate processing apparatus forms a film on the substrate using particles emitted by sputtering of the cathode.

13. The substrate processing apparatus according to claim 1, wherein the particle source is an ion beam source.

14. The substrate processing apparatus according to claim 1, configured such that the substrate is processed by the particles while the substrate is conveyed by the conveyance mechanism.

15. The substrate processing apparatus according to claim 1, wherein the controller is configured to rotate the movement mechanism based on the conveyance of the substrate by the conveyance mechanism.

\* \* \* \* \*